United States Patent [19]
Onishi

[11] Patent Number: 5,878,201
[45] Date of Patent: Mar. 2, 1999

[54] DISK SYSTEM AND FACTORY AUTOMATION CONTROLLER AND METHOD THEREFOR

[75] Inventor: Sakuyuki Onishi, Aichi, Japan

[73] Assignee: Mitsubishi Denki Kabushiki Kaisha, Tokyo, Japan

[21] Appl. No.: 705,978

[22] Filed: Aug. 30, 1996

Related U.S. Application Data

[63] Continuation of Ser. No. 372,646, Jan. 13, 1995, abandoned.

[30] Foreign Application Priority Data

Feb. 23, 1994 [JP] Japan ................................. 6-025597

[51] Int. Cl.⁶ ..................................................... G06F 11/34
[52] U.S. Cl. ........................................................ 395/182.04
[58] Field of Search .......................... 395/182.04, 182.03, 395/182.05, 182.06, 182.07, 182.18; 711/164; 701/114; 365/228

[56] References Cited

U.S. PATENT DOCUMENTS

| | | |
|---|---|---|
| 4,941,136 | 7/1990 | Breitung, II .............................. 368/8 |
| 5,185,884 | 2/1993 | Martin et al. ...................... 395/182.04 |
| 5,210,865 | 5/1993 | Davis et al. ....................... 395/182.04 |
| 5,269,016 | 12/1993 | Butler et al. ....................... 395/182.04 |
| 5,430,866 | 7/1995 | Lawrence et al. ................. 395/182.18 |
| 5,432,922 | 7/1995 | Polyzois et al. ................... 395/182.04 |
| 5,546,536 | 8/1996 | Davis et al. ....................... 395/182.18 |

*Primary Examiner*—Albert DeCady
*Attorney, Agent, or Firm*—Sughrue, Mion, Zinn, Macpeak & Seas, PLLC

[57] ABSTRACT

A disk system that can be easily replaced, repaired, and maintained in the field of a factory when subjected to failure and an FA controller using such disk system. The disk system has two disk units. On a front panel of the disk system are an ON/OFF selector button, a copy instruction button, and the like. By operating these buttons, data of a disk unit in operation can be copied to a disk unit replaced after failure. In addition, disk life can be predicted by built-in integrating timers and the like.

15 Claims, 12 Drawing Sheets

FIG. 13

```
Disk unit A   Error:102                                  ⎫
Disk unit A   Error:103                                  ⎬ ~601
                                                         ⎭
>DISKMENT A=OFF                                          ~602

Disk unit A is put in offline.                           ⎫
Disk status: unit A -- offline,   unit B -- online.      ⎬ ~603
Replace disk unit A.                                     ⎭

>DISKMENT A=ON                                           ~604

Disk unit A is put in online.                            ⎫
Disk status: unit A -- online,   unit B -- online.       ⎬ ~605

>DISKCOPY B A                                            ~606

Content of disk unit B is being copied to disk unit A.   ~607
Copy completed.                                          ~608

>
```

DISK SYSTEM AND FACTORY AUTOMATION CONTROLLER AND METHOD THEREFOR

This is a Continuation of application Ser. No. 08/372,646 filed Jan. 13, 1995, now abandoned.

BACKGROUND OF THE INVENTION

1. Field of the Invention

The invention relates to a disk system that can easily recover from a failure, and to a factory automation (FA) controller using such disk system.

2. Description of the Background Art

FIG. 10 is a block diagram showing a configuration of a conventional FA controller. In FIG. 10, a disk system 101 comprises a CPU 2, a bus 2a connected between CPU 2 and disk interfaces 3a, 3b that are connected respectively to disk units 4a and 4b and serve to match signals between bus 2a and disk units 4a and 4b. A memory 107 is connected to bus 2a and has an area in memory 107a that stores a disk mirroring program. The disk mirroring program is designed to execute a duplicating operation for writing the same content to the two disk units, disk unit 4a and disk unit 4b, in the event of a failure.

Reference numeral 21 designates a main CPU of the FA controller that executes the applications program and has connected thereto a bus 21a. Reference numeral 122 designates a memory connected to bus 21a; and 122a is an area in memory 122 at which an application program is stored. Reference numeral 150 designates a console that can receive data through keys and that can display data; and 3 is a disk interface for matching a signal between bus 21a and bus 2a.

The disk mirroring program stored in area 107a is designed to not only write data that is transferred from main CPU 21 based on a disk writing instruction outputted from main CPU 21 during the normal operation to disk units 4a, 4b through disk interfaces 3a, 3b under the control of CPU 2, but also allow the operation of the FA controller to be continued by one of disk units 4a, 4b when the other one has failed. Main CPU 21 operates based on the above-mentioned application program.

FIG. 11 is a diagram illustrative of an exemplary location of console 150 and exemplary locations of the FA controller body and a programmable controller. FIG. 12 is an enlarged perspective view showing appearances of the FA controller body and the programmable controller installed in a factory in FIG. 11.

In FIG. 12, reference numeral 1202 designates the FA controller body which includes a main CPU 1201, comprising main CPU 21 and memory 122; and an interface 1204 dedicated to the FA controller shown in FIG. 10. The FA controller body 1202, as illustrated, shows portions of FA controller shown in FIG. 10 excluding console 150. Reference numeral 1203 designates the programmable controller connected to the FA controller.

In FIG. 11, reference numeral 1101 designates a case where console 150 is installed in an office of a factory; 1102, a case where console 150 is installed in a monitor room of the factory; 1103, the installation of FA controller body 1202 and programmable controller 1203 assembled into a machine; and 1104, the installation of FA controller 1202 and programmable controller 1203 assembled in a control panel.

Generally, as shown in FIG. 11, FA controller body 1202 and programmable controller 1203 are installed in the field of a factory, whereas console 150 is installed in an office or a monitor room remote from the field.

FIG. 13 shows an exemplary content to be displayed on console 150 while disk unit 4a that has failed during the operation of the disk mirroring program is being replaced with a good one. In console 150, disk unit 4a is indicated as disk unit A, and disk unit 4b is indicated by disk unit B.

In FIG. 13, reference numeral 601 designates a display message when disk unit 4a is in failure. When such display message is found on the screen, an operator switches disk unit 4a offline by inputting an instruction designated by 602 through the keys of console 150.

When disk unit 4a has been placed offline, such display messages as reference numeral 603 appear. The operator, after confirming these display messages, replaces disk unit 4a with a good one.

When the replacement of disk unit 4a has been completed, the operator puts disk unit 4a in an "online" state by operating the keys of console 150.

As disk unit 4a is online, such display messages as designated by 605 appear. The operator, after confirming these display messages, inputs such instructions as designated by 606 by operating the keys of console 150 to copy the content of disk unit 4b having the correct data to disk unit 4a.

Such a display message as designated by 607 appears during the copy operation; and upon end of the copy operation, such a display message as designated by 608 appears.

Since the conventional disk system and the conventional FA controller using such disk system are constructed as described above, when one of disk units 4a, 4b within disk system 101 has failed, the operation of confirming the failure, the replacement of the disk unit, and the copy operation of the disk unit must be instructed from console 150 connected to the main CPU. However, where such disk system or FA controller is installed in a field of a factory as shown in FIG. 12, i.e., a location remote from the disk unit that has failed in many cases. Since the console 150 operation alternates with the removal and installation of the disk in the replacement, the replacement is time-consuming. In addition, there is a case in which console 150 is not installed at all, and in such case console 150 must be connected expediently.

SUMMARY OF THE INVENTION

The invention has been made to overcome these problems. Accordingly, the object of the invention is to provide a disk system capable of replacing disk units with ease and copying the recorded content without involving the console at the time one of the disk units has failed.

To achieve the above object, the invention is applied to a disk system that includes: a central processing unit having an operational processing section and storage means for storing programs to be executed by the operational processing section; first and second disks, each being capable of receiving and transmitting data from and to an external unit through the central processing unit; first switch means having a setting so that a content of the first disk is transferred to the second disk or a content of the second disk is transferred to the first disk; and second switch means for instructing the central processing unit to execute data transfer between the first and second disks based on a setting of the first switch means. The central processing unit executes data transfer between the first and second disks based on settings of the first and second switch means by a predetermined program stored in the storage means at a timing other than a timing at which the first and second disks are intercommunicating with the external unit.

BRIEF DESCRIPTION OF THE DRAWINGS

FIG. 13 is a diagram showing an exemplary console output of a disk unit replacement in the conventional example.

DESCRIPTION OF THE PREFERRED EMBODIMENTS

The disk system and the FA controller using the disk system of the invention are characterized as being continuously operated with one of a plurality of the disk units within the disk system, even if one disk unit has failed, and as allowing data of the disk unit in operation to be copied to a disk unit that replaces the failed disk unit through the operation of the operation panel of the disk system.

Figure 1:
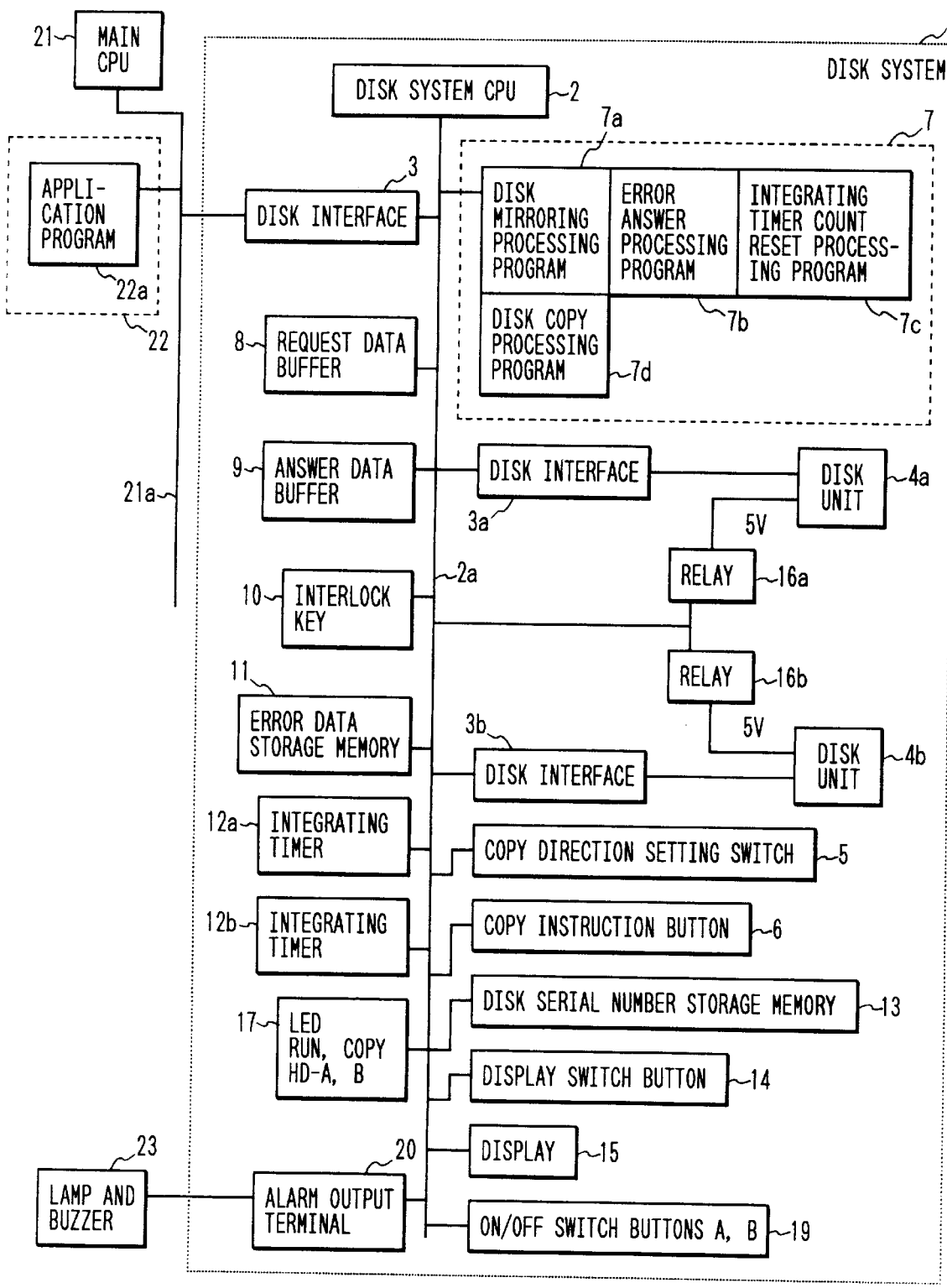
FIG. 1 is a block diagram showing the configuration of an FA controller in an embodiment of the invention.

An embodiment of the invention will now be described with reference to the drawings. FIG. 1 is a block diagram showing a configuration of an FA controller. In FIG. 1, reference numeral 1 designates a disk system; 2, an operation section, which is, e.g., a disk system CPU; 2a, a bus connected to disk system CPU 2; 21, an upper-level central processing unit, which is, e.g., a main CPU of the FA controller; 21a, a bus connected to main CPU 21; 22, a memory to be accessed by main CPU 21 through bus 21a; 22a, an area in memory 22 at which an application program is stored; 3, a disk interface for matching a signal between bus 2a and bus 21a; 4a, a first disk within disk system 1, which is, e.g., a disk unit; 4b, a second disk within disk system 1, which is, e.g., a disk unit; 3a, a disk interface for matching a signal between disk unit 4a and bus 2a, disk unit 4a being connected to bus 2a through disk interface 3a; 3b, a disk interface for matching a signal between disk unit 4b and bus 2a, disk unit 4b being connected to bus 2a through disk interface 3b; 7, a storage means, which is, e.g., a memory connected to bus 2a; 7a, a disk mirroring processing program stored in memory 7; 7b, an error answer processing program stored in memory 7; 7c, an integrating timer count reset processing program stored in memory 7; 7d, a disk copy processing program stored in memory 7.

Reference numeral 8 designates a request data buffer, connected to bus 2a, for storing data indicating a processing request content from main CPU 21; 9, an answer data buffer, connected to bus 2a, for storing a processing result to be answered to main CPU 21; 10, a transfer stop setting unit, e.g., an interlock key, which is designed so that the state (whether the state is an interlocked state or not) can be read by disk system CPU 2 through bus 2a; 11, a nonvolatile error data storage memory, connected to bus 2a, for chronologically storing error data so that the error history of each of disk units 4a, 4b can be traced later; 12a, a first nonvolatile integrating timer, e.g., an integrating timer, which is connected to bus 2a for integrating the power supply turn-on time of disk unit 4a; 12b, a second nonvolatile integrating timer, e.g., an integrating timer, which is connected to bus 2a for integrating a power supply turn-on time of disk unit 4b; 13, a nonvolatile serial number memory, e.g., a disk serial number storage memory, which is connected to bus 2a for storing the manufacturers' names and serial numbers of disk units 4a and 4b; 16a, a relay switch for turning on and off a power supply of disk unit 4a energized based on a signal on bus 2a; and 16b, a relay switch for turning on and off a power supply of disk unit 4b energized based on a signal on bus 2a.

Figure 2:
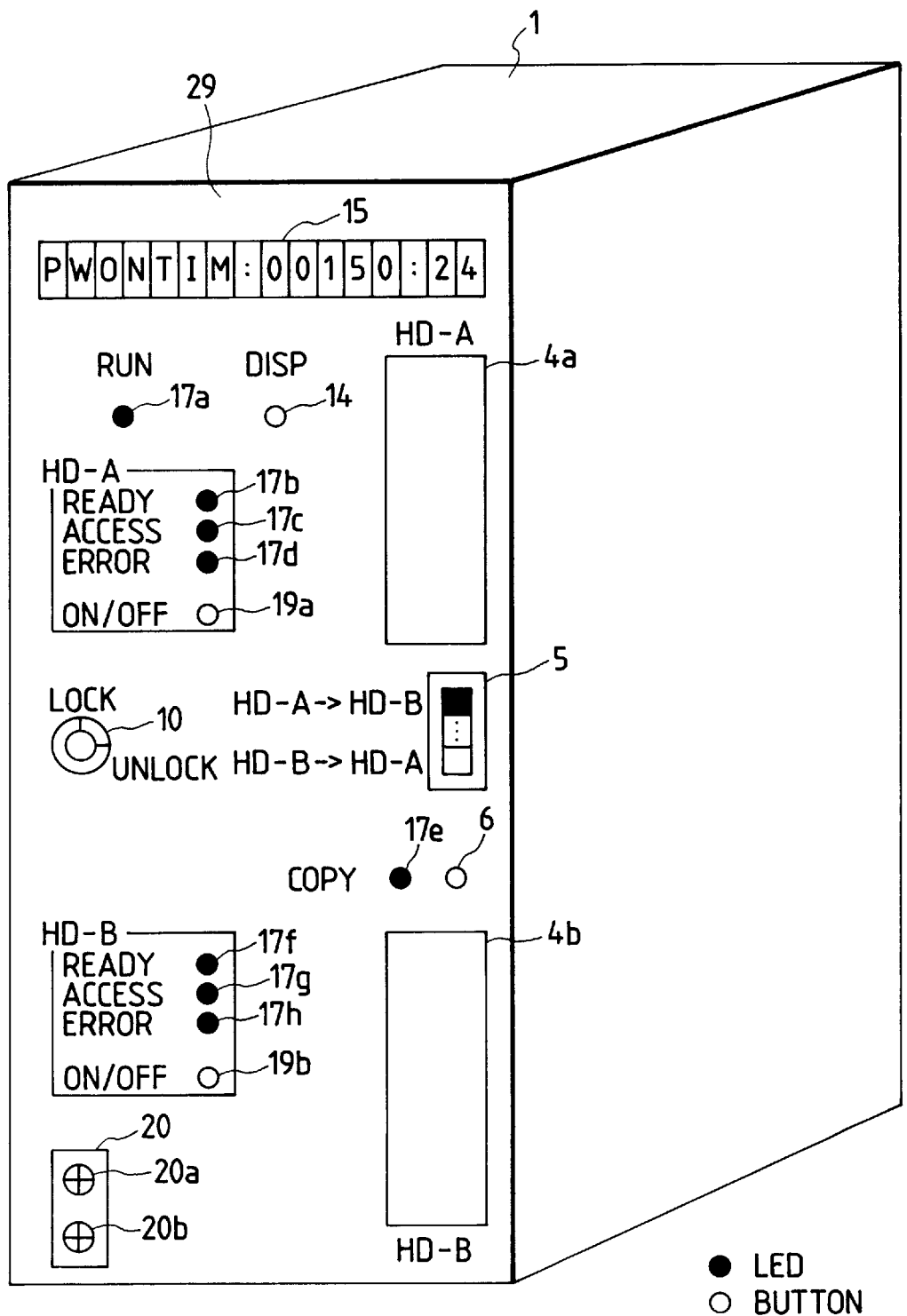
FIG. 2 is a diagram showing an appearance of a disk system in the embodiment of the invention.

FIG. 2 is a perspective view showing an appearance of disk system 1. In FIG. 2, reference numeral 1 designates the disk system; 4a, 4b, the disk units; 5, a first switch means, e.g., a copy direction setting switch; 6, a second switch means, e.g., a copy instruction button; 10, the transfer block setting means, e.g., the interlock key; 14, an integrating timer display selector switch means, e.g., display selector button; and 15, a display.

Reference numeral 17a designates an LED for indicating that disk system 1 is in a RUN state; 17b, an LED for indicating that disk unit 4a is in a READY state; 17c, an LED for indicating that disk unit 4a is in an ACCESS state; 17d, an LED for indicating that an error has occurred at disk unit 4a.

Reference numeral 17e designates an LED for indicating that a data transfer operation is being performed between disk unit 4a and disk unit 4b; 17f, an LED for indicating that disk unit 4b is in READY state; 17g, an LED for indicating that disk unit 4b is in ACCESS state; and 17h, an LED for indicating that an error has occurred at disk unit 4b.

Reference numerals 19a, 19b designate on/off selector buttons for switching online/offline for disk units 4a, 4b; 20, an alarm unit; and 23, a lamp and buzzer mounted on alarm unit 20, which gives an alarm as necessary.

An operation of disk mirroring program 7a of disk system 1 of the invention will be described with reference to flowcharts shown in FIGS. 3, 4, 5, and 6.

Figure 3:
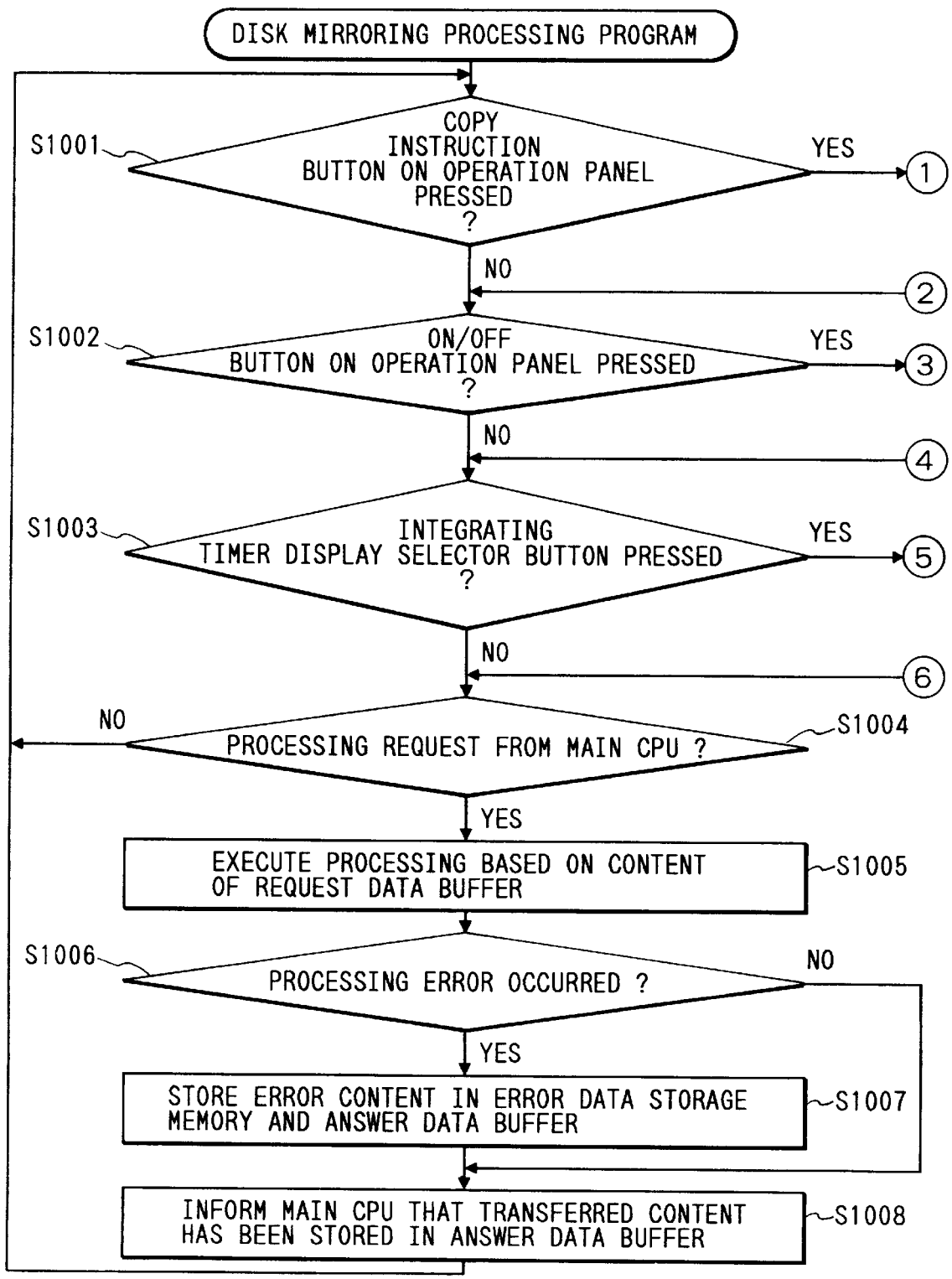
FIG. 3 is a flowchart showing an operation of a disk mirroring processing program in the embodiment of the invention.

Upon turning on of the power supply, the processing starts with step S1001 of FIG. 3.

Figure 4:
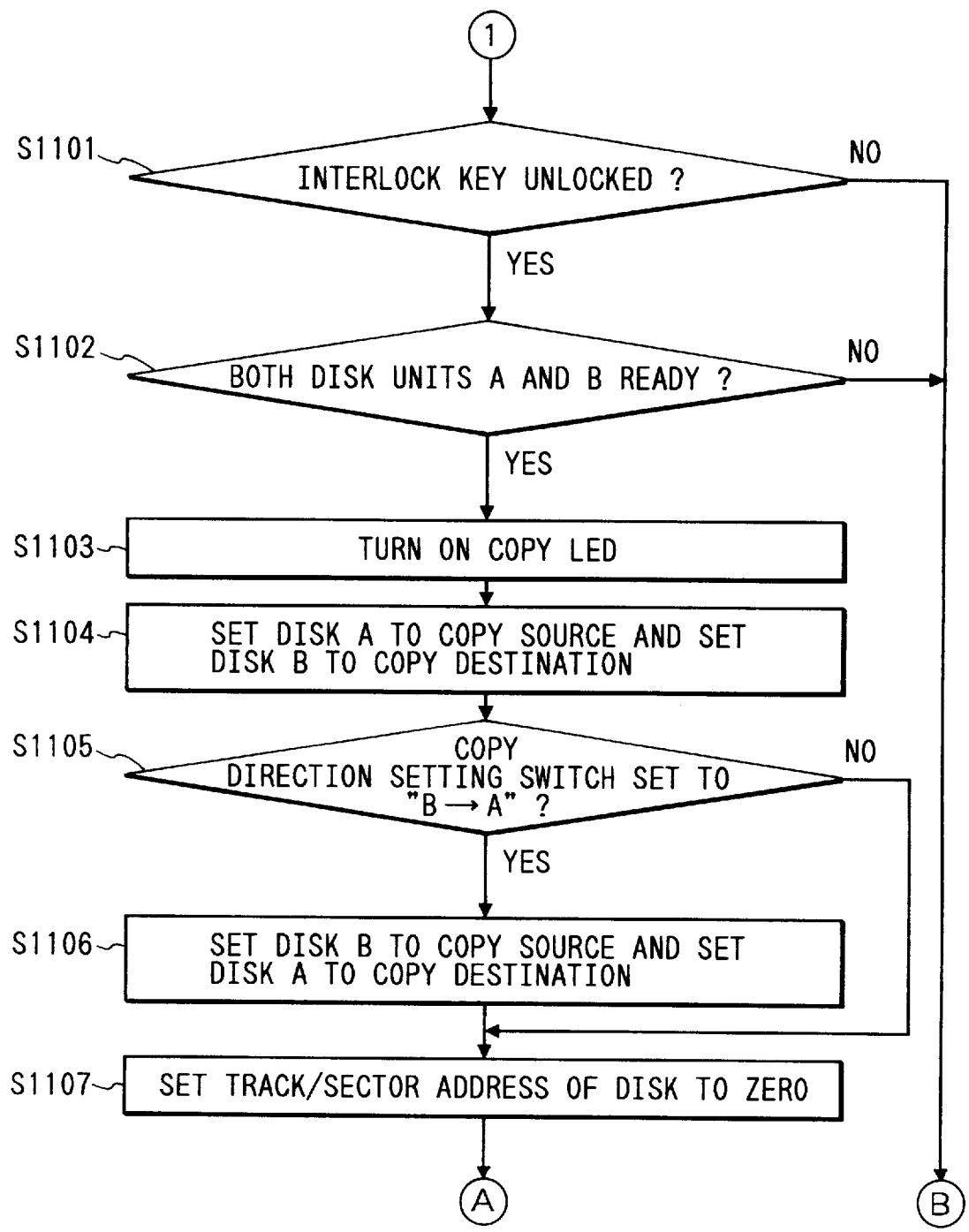
FIG. 4 is a flowchart showing a disk copy operation in the embodiment of the invention.

In step S1001, disk CPU 2 judges through bus 2a whether or not copy instruction button 6 has been pressed. If button 6 has been pressed, step 1101 of FIG. 4 is executed to start the processing shown in FIGS. 4 and 5, and then step S1002 is executed. If button 6 has not been pressed, then step S1002 is executed directly.

In step S1002, disk CPU 2 judges through bus 2a whether or not ON/OFF switch button 19b has been pressed. If button 19b has been pressed, step S1201 is executed to start the processing shown in FIG. 6, and then step S1003 is executed. If button 19b has not been pressed, step S1003 is executed directly.

Figure 8:
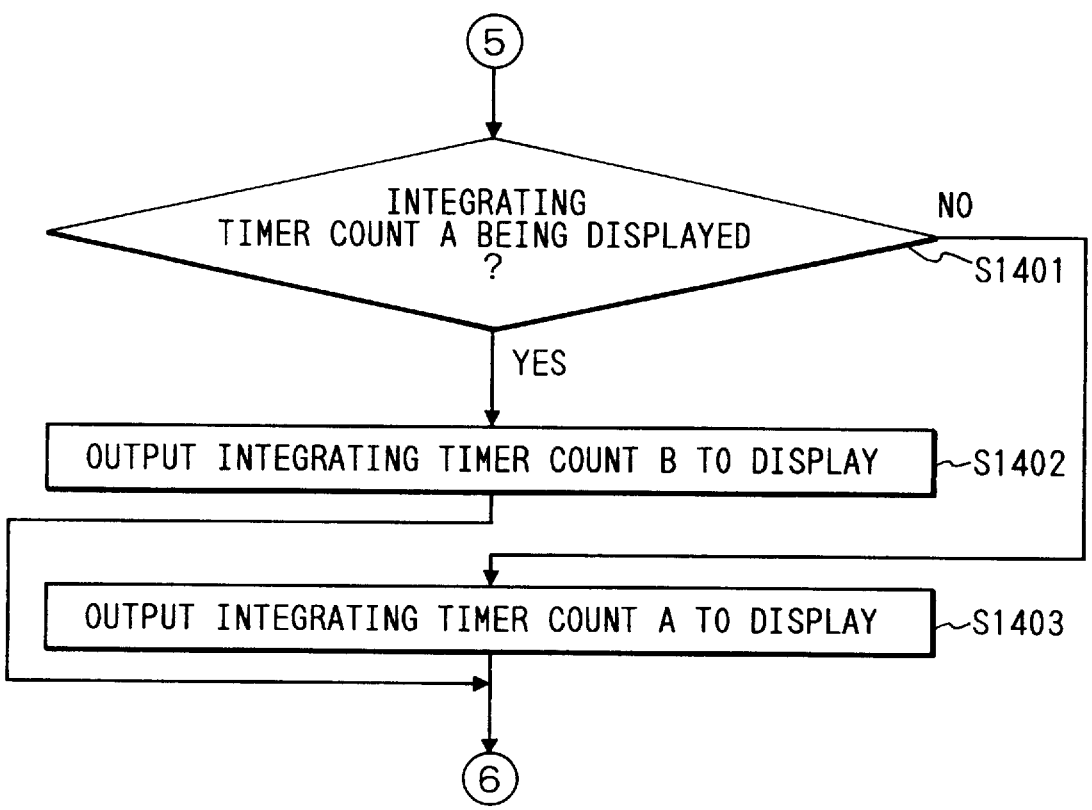
FIG. 8 is a flowchart showing an operation of an integrating timer count display switch processing in the embodiment of the invention.

In step S1003, disk CPU 2 judges through bus 2a whether or not integrating timer display selector button 14 has been pressed. If button 14 has been pressed, step S1401 shown in FIG. 8 is executed to start the processing shown in FIG. 8, and then step S1004 is executed. If button 14 has not been pressed, step S1004 is executed directly.

In step S1004, it is judged whether or not main CPU 21 has made a processing request based on either a request processing command code or 0 is written in the head of request data buffer 8.

The command code includes: a code that instructs reading from the disk (in this case, disk sector data must also be written in request data buffer 8); a code that instructs writing to the disk (in this case, data to be written must also be written in request data buffer 8); a code that instructs reading of a serial number of an installed disk unit, and the like; and a code that instructs writing of disk error data or the like.

If no command code has been written in the head of request data buffer 8, the processing is terminated judging that no processing request has been made by main CPU 21, and step S1001 is executed. If a command code has been written, step S1005 is executed for the processing instructed by this command code. Then, step S1006 is executed.

If the command code instructs writing to the disk, the same data is written to both disk units 4a, 4b (the data to be written is the content stored in request data buffer 8 together with the command code). At the time of reading, the data is read from one of the disk units specified in advance, and the read data is stored in answer data buffer 9 so that the data can be read from main CPU 21 (the read sector is specified by data indicating a sector stored in request data buffer 8 together with the command code).

In step S1006, whether or not an error has occurred during the processing in step S1005 is judged. If no error has occurred, step S1008 is executed directly. If an error has occurred, step S1007 is executed, in which the error content is stored in error data storage memory 11 and answer data buffer 9, and then step S1008 is executed.

In step S1008, the result of the processing is written in answer data buffer 9 to inform main CPU 21 that the data can be read from main CPU 21, and then step S1001 is executed.

Figure 5:
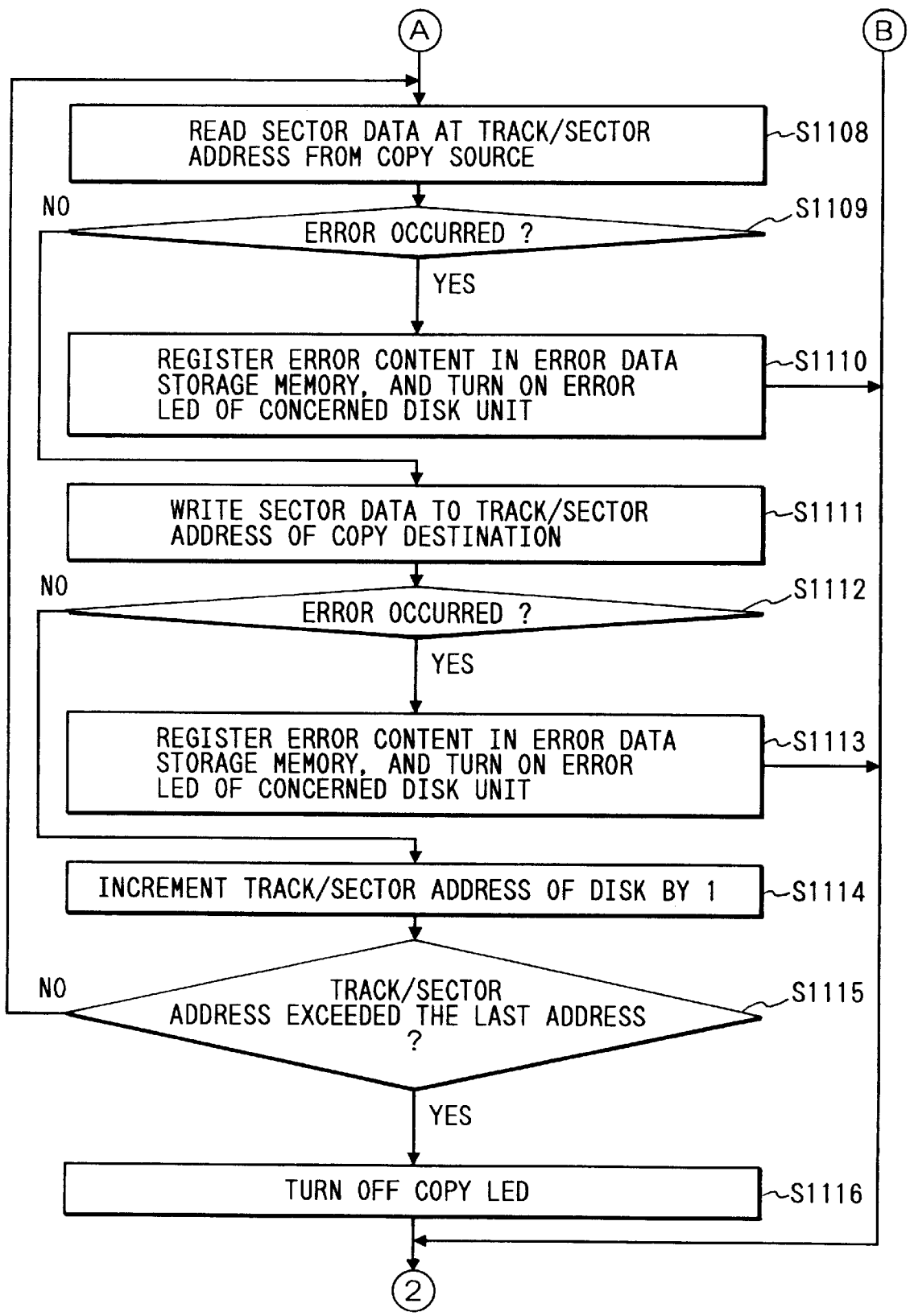
FIG. 5 is a flowchart showing the disk copy operation in the embodiment of the invention.

Then, a copy operation, i.e., an operation to be performed when step S1101 of FIG. 4 succeeds step S1001 of FIG. 3 will be described with reference to the flowcharts shown in FIGS. 4 and 5. In step S1101 of FIG. 4, whether or not interlock key 10 is in a LOCK or UNLOCK state is judged. If interlock key 10 is in LOCK state, the copy processing is not executed, and step S1002 of FIG. 3 is executed. If interlock key 10 is in UNLOCK state, step S1102 is executed.

In step S1102, whether or not both disk units 4a, 4b are in READY state is judged. If neither disks are in READY state, the copy processing is not executed, and step S1002 is executed. If both disks are in READY state, step S1103 is executed.

In step S1103, COPY LEAD 17e is turned on, and step S1104 is executed.

In step S1104, a copy direction default is set so that disk unit 4a is the copy source and disk unit 4b is the copy destination, and step S1105 is executed.

In step S1105, whether or not copy direction setting switch 5 is set so that data is copied from disk unit 4b to disk unit 4a is judged. If not, step S1107 is executed. If the copy direction is from disk unit 4b to disk unit 4a, then step S1106 is executed to set the copy direction so that disk unit 4b is the copy source and disk unit 4a is the copy destination. Then, step S1107 is executed.

In step S1107, the disk track/sector address is reset to the initial value 0, and step S1108 is executed.

In step S1108, the data from the sector specified by the track/sector address of the source disk unit is read, and step S1109 is executed.

In step S1109, whether or not an error has occurred during the reading operation in step S1108 is judged. If an error has occurred, step S1110 is executed to store the error content in error data storage memory 11. Then, step S1002 of FIG. 3 is executed. If no error has occurred, step S1111 is executed.

In step S1111, the data read in step S1108 is written to the sector specified by the track/sector address of the destination disk unit, and then step S1112 is executed.

In step S1112, whether or not an error has occurred during the writing operation in step S1111 is judged. If an error has occurred, not only step S1113 is executed to store the error content in error data storage memory 11, but also either ERROR LED 17d or ERROR LED 17h is turned on, and then step S1002 of FIG. 3 is executed. If no error has occurred, step S1114 is executed to increment the track/sector address of the disk by 1. Then, step S1115 is executed.

In step S1115, whether or not the track/sector address has reached the last address is judged. If the address has not reached the last address, step S1108 is executed again, whereas if the address has reached the last address, then the loop is terminated, and step S1116 is executed.

In step S1116, COPY LED 17e is turned off, and step S1002 of FIG. 3 is executed to terminate the copy processing.

The above-mentioned copy operation can be also performed in cases other than the case in which a disk unit has failed. That is, e.g., if copy instruction button 6 is pressed while the system is running, a backup copy of the disk contents can be produced.

Figure 6:
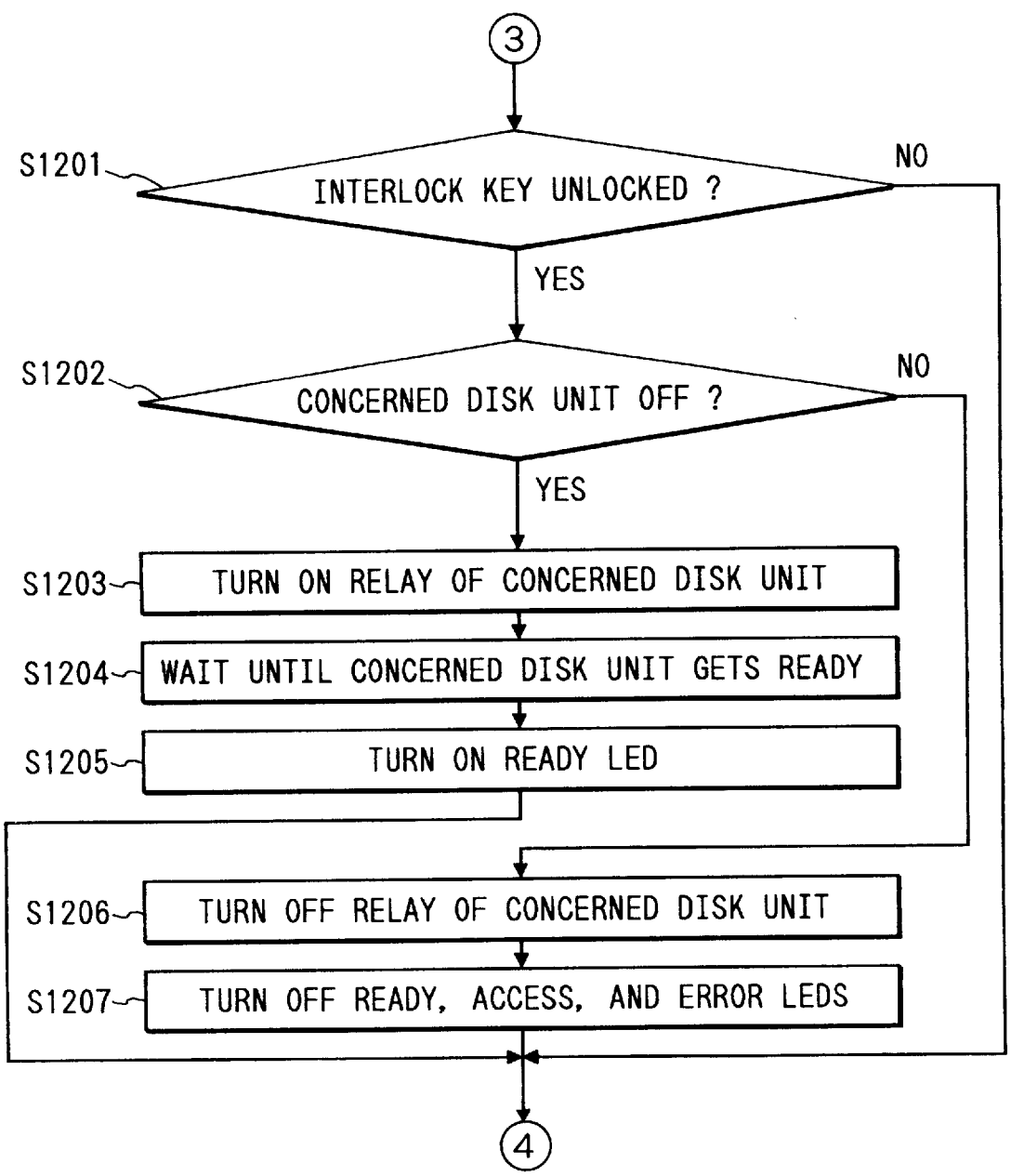
FIG. 6 is a flowchart showing a disk unit ON/OFF operation in the embodiment of the invention.

Then, an operation at the time ON/OFF button 19a or ON/OFF button 19b of the disk units is pressed, i.e., when step S1201 of FIG. 6 is executed directly from step S1002 of FIG. 3 will be described. In FIG. 6, whether or not interlock key 10 is set to UNLOCK state is judged in step S1201. If interlock key 10 is not set to UNLOCK state, the copy processing is not executed, and step S1003 of FIG. 3 is executed. If interlock key 10 is set to UNLOCK state, step S1202 is executed.

In step S1202, whether or not a disk unit is on or off is judged.

If the power supply of the disk unit whose ON/OFF button has been pressed is turned off, step S1203 is executed, whereas if the power supply of such disk unit is turned on, step S1206 is executed.

In step S1203, the excitation winding (not shown) of a relay of the disk unit (relay 16a if the disk unit is disk unit 4a, and relay 16b if the disk unit is disk unit 4b) is energized, and the power supply of the disk unit is turned on. Then, step S1204 is executed.

In step S1204, the system waits until the disk unit gets READY, and step S1205 is executed upon the disk unit being READY.

In step S1205, the READY LED of the disk unit (READY LED 17b if the disk unit is disk unit 4a, and READY LED 17f if the disk unit is disk unit 4b) is turned on, and step S1003 of FIG. 3 is executed.

If step S1206 is executed immediately after step S1202, i.e., in the case where it is judged that the disk unit is not off in step S1202, then the energizing of the excitation winding of the relay of the disk unit is stopped in step S1206 to turn off the power supply of the disk unit. Then, step S1207 is executed.

In step S1207, the READY LED, ACCESS LED, ERROR LED of the disk unit are turned off, and step S1003 of FIG. 3 is executed.

A procedure for removing disk unit 4a or disk unit 4b to be followed by an operator in the disk system, which is the embodiment of the invention, will be described next.

In order to remove disk unit 4a, it is confirmed that LEDs 17b to 17d and LED 17e have been turned off. Once that LEDs 17b to 17d and LED 17e have been turned off is confirmed, the operator removes disk unit 4a from the disk system 1.

If not all the LEDs 17b to 17d and LED 17e have been turned off, first, interlock key 10 is set to UNLOCK state if set to LOCK state. Then, ON/OFF selector button 19a is pressed until all the LEDs 17b to 17d and LED 17e are turned off. When all the LEDs have been turned off, disk unit 4a is taken out of the disk system.

The disk system is designed so that the disk units cannot be removed by a not shown mechanism as long as the LEDs are not turned off.

In order to remove disk unit 4b, the same procedure is followed except that LEDs 17b to 17d are substituted by LEDs 17f to 17h and that ON/OFF selector button 19a is substituted by ON/OFF selector button 19b.

How disk unit 4a is mounted will now be described. First, after confirming that interlock key 10 is in UNLOCK state, disk unit 4a is mounted on the disk system. If interlock key 10 is in LOCK state, interlock key 10 is set to UNLOCK state in advance.

Then, ON/OFF selector button 19a is pressed until LED 17b turns on. When LED 17b has turned on, disk unit 4a gets ready for operation, completing the disk unit mounting operation.

Then, the operation of copying a content stored in disk unit 4b to disk unit 4a will be described.

After confirming that interlock key 10 is set to UNLOCK state, copy direction setting switch 5 is set so that a copying is made from disk unit 4b to disk unit 4a. If interlock key 10 is in LOCK state, interlock key 10 is set to UNLOCK state in advance.

Copy instruction button 6 is pressed to turn on LED 17e, which then causes the system to start copying. Upon end of the copying, LED 17e turns off, which completes the operation of copying the content stored in disk unit 4b to disk unit 4a.

Error answer processing will be described with reference to the flowchart of FIG. 7. Error answer processing program 7b is called and executed by step S1004 of FIG. 3 when a code that instructs the reading of a content of error data storage memory 11 of a disk unit is written to the head of request data buffer 8 as a request processing command code.

Figure 7:
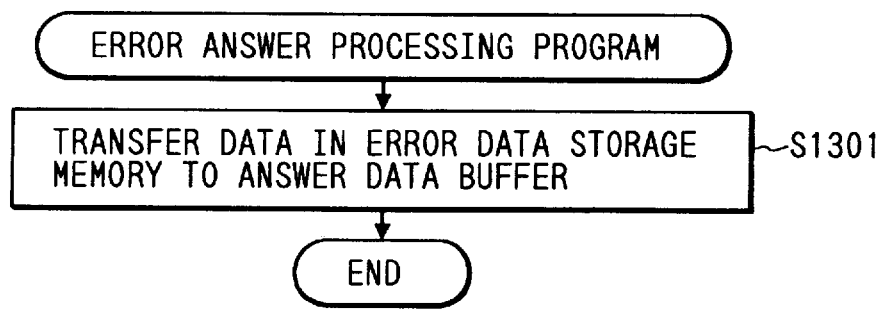
FIG. 7 is a flowchart showing an error answer processing program in the embodiment of the invention.

In step 1301 of FIG. 7, error data stored in error data storage memory 11 is transferred to answer data buffer 9, making the data readable from main CPU 21.

An operation concerning integrating timer display selector button 14 on an operation panel 29 will be described with reference to FIG. 8.

When it is judged that display selector button 14 is being pressed in step S1003 of FIG. 3, step S1401 is executed to start the processing shown in FIG. 8.

In step S1401, whether or not the content of integrating timer 12a is displayed on display 15 is judged. If the content of integrating timer 12a is displayed, step S1402 is executed to select the display so that the content of integrating timer 12b is outputted on display 15. Then, step S1004 of FIG. 3 is executed to terminate the selecting operation. If the content of integrating timer 12a is not displayed in step S1401, step S1403 is executed to select the display so that the content of integrating timer 12a is outputted. Then, step S1004 of FIG. 3 is executed to terminate the selecting operation.

Integrating timer 12a stores the integrated operating time of disk unit 4a, whereas integrating timer 12b stores the integrated operating time of disk unit 4b.

An operation of integrating timer count reset program 7c will be described with reference to FIG. 9.

The contents of integrating timers 12a and 12b are valid until the disk units are replaced. Once a disk unit is replaced, the content of the integrating timer corresponding to the replaced disk unit must generally be altered at the time of replacement. That is, if the newly installed disk unit has a history of having already been used, the content of the corresponding integrating timer must be altered to indicate the time already used, whereas if the replaced disk unit is an unused, new disk unit, then the content of the corresponding integrating timer must be reset to 0.

Integrating timer count reset program 7c has the function of automatically setting the content of a disk unit to 0 upon replacement of such disk unit.

Figure 9:
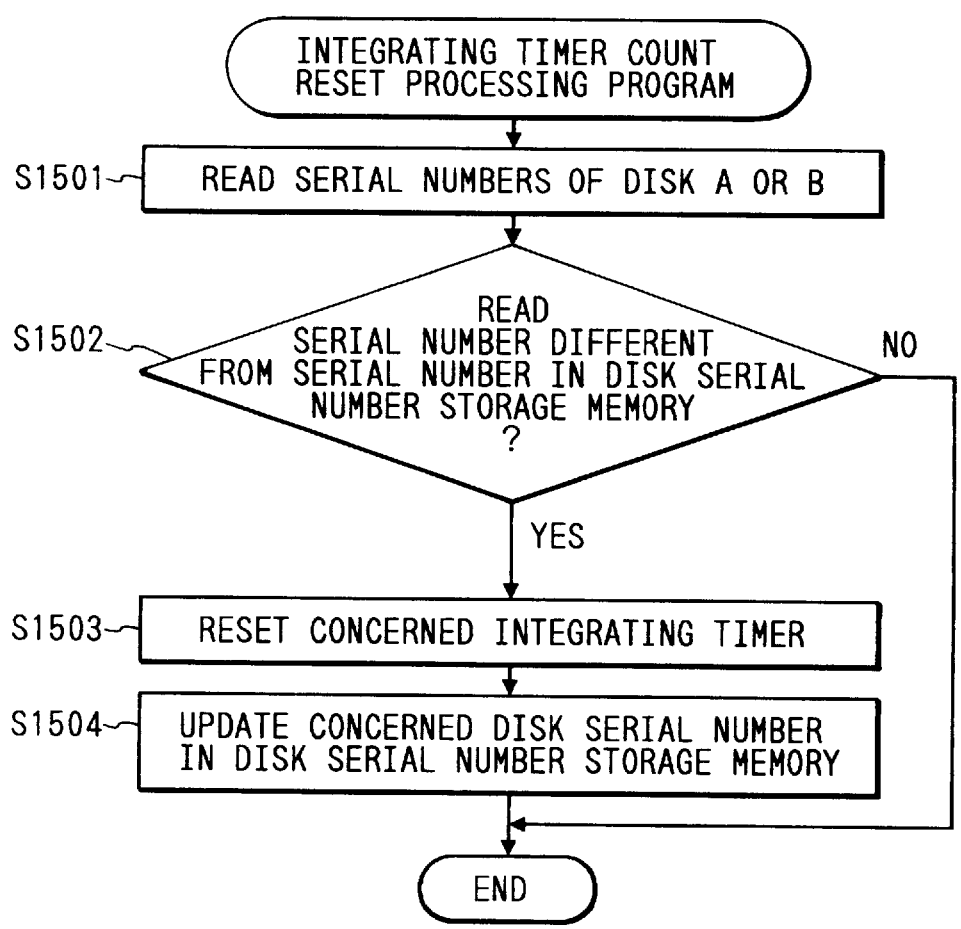
FIG. 9 is a flowchart showing an integrating timer count reset processing program in the embodiment of the invention.
Figure 10:
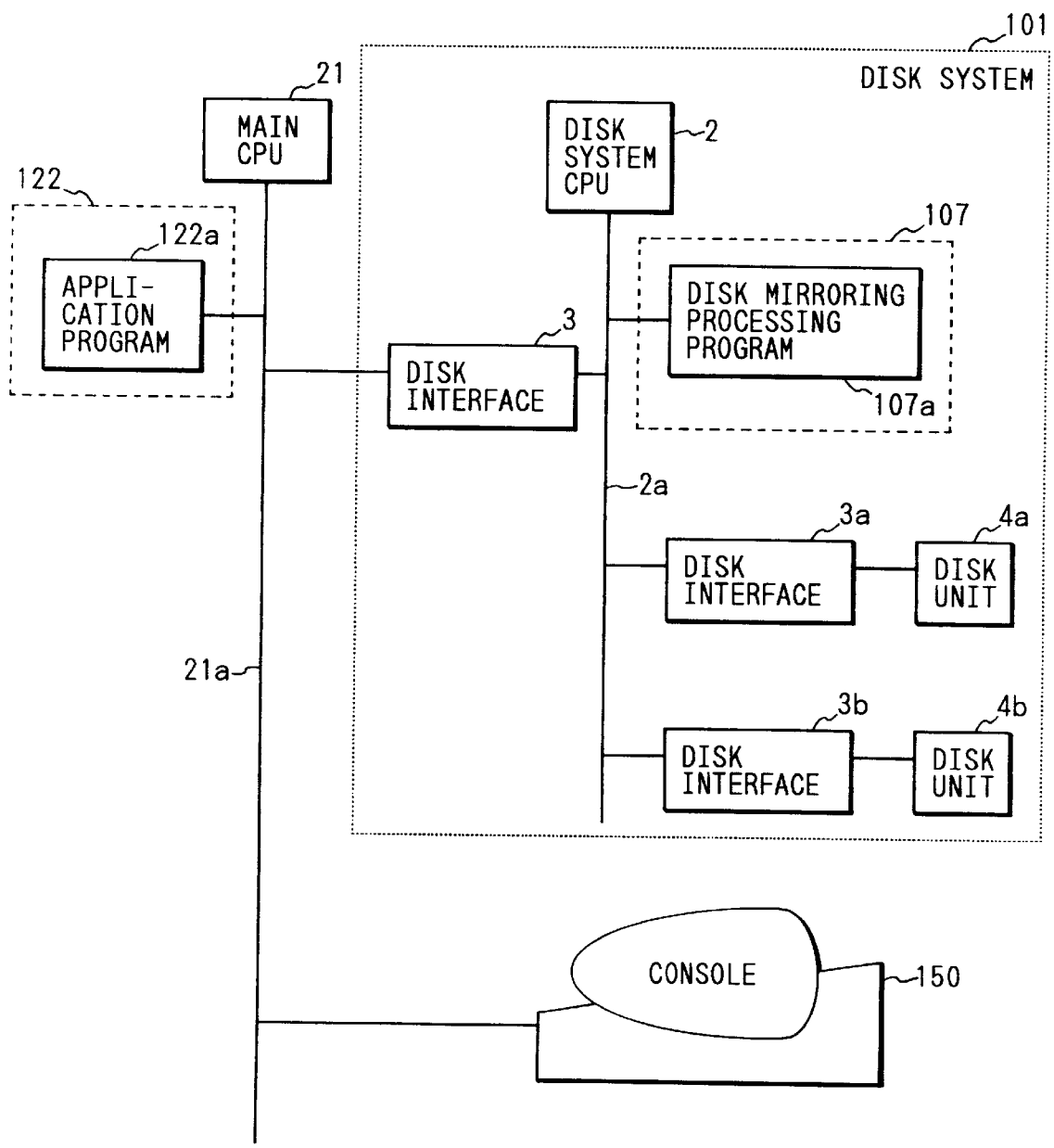
FIG. 10 is a block diagram of a conventional FA controller.
Figure 11:
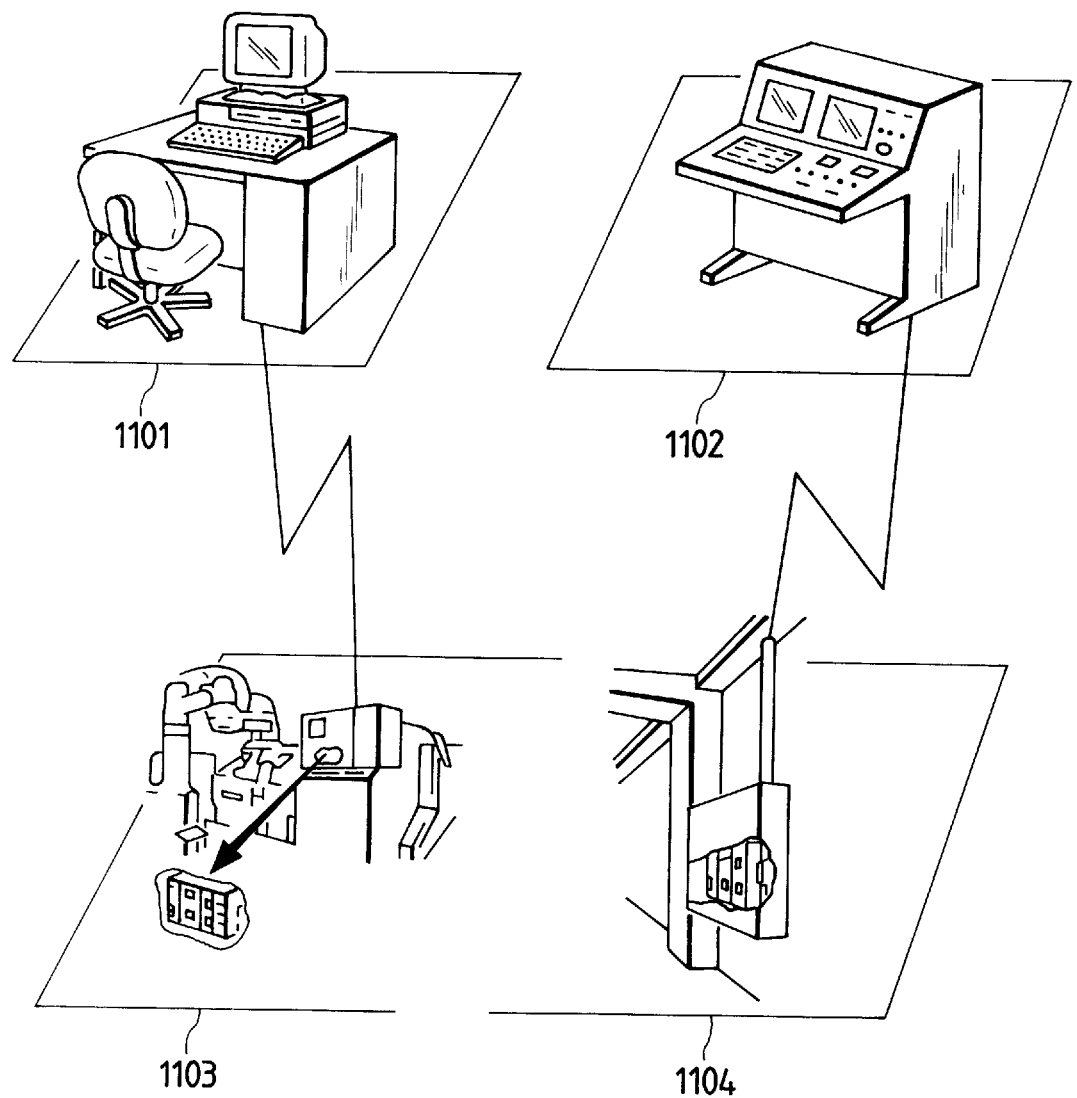
FIG. 11 is a diagram illustrative of an example of the installation of an FA controller in a factory.
Figure 12:
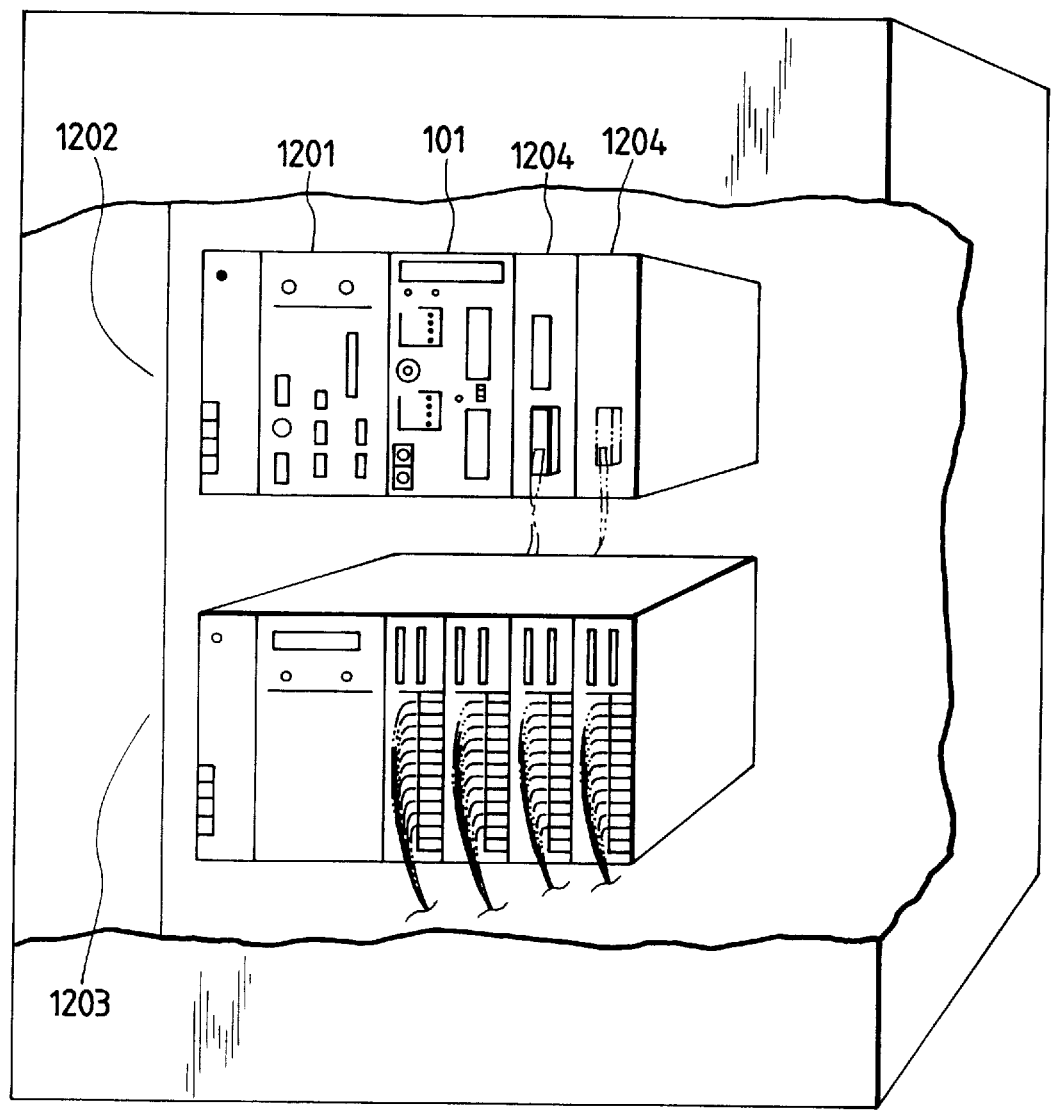
FIG. 12 is an enlarged perspective view showing an FA controller body and a programmable controller shown in FIG. 11.

When the power supply is turned on after the replacement of a disk unit or the like, integrating timer count reset program 7c is executed automatically, performing the operation shown in FIG. 9.

In FIG. 9, first, in step S1501, the serial numbers of disk units 4a and 4b are read, and then step S1502 is executed. The reading of the serial number of disk unit 4a or 4b is effected by disk CPU 2 executing a predetermined instruction.

In step S1502, the serial number stored in disk serial number storage memory 13 is compared with the serial number read in step S1501. If both serial numbers coincide with each other, the processing is terminated, whereas if not, step S1503 is executed.

In step S1503, the content of the corresponding integrating timer is reset, and then step S1504 is executed.

In step S1504, the serial number stored in disk serial number storage memory 13 is updated to the serial number read in step S1501, and the processing is then terminated.

As described in the foregoing, even if one of the disks within the disk system has failed, not only the system can be continuously operated with the other disk unit, but also the data of the disk unit in operation can be copied to a new disk unit that replaces the failed disk unit through the operation panel of the disk system. Therefore, the invention can provide the advantage that the on-the-site backup operation can be performed with ease.

Further, the interlock key for blocking the disk from copying data is arranged. Therefore, the invention can provide the advantage of not losing the disk data by erroneous operation.

Still further, the failure history of each disk unit can be referred to by the main CPU, so that the main CPU can predict the timing to replace a disk unit. Therefore, the invention can provide the advantage that the protection of data of the disk system is achieved with ease, thus contributing to improving the safety and reliability of the data.

Still further, the progressive operating time of each disk unit can be referred to by the main CPU, so that the main CPU can predict the expiration of an operating time guaranteed by the manufacturer of the disk unit. Therefore, the invention can provide the advantage that the data of each disk unit can be protected safely.

Still further, the serial number of each disk unit is stored in the disk serial number storage memory that holds the content even when the power supply is disconnected, the held content and the serial number of a currently installed disk unit are compared, if both numbers do not coincide with each other, not only the content of the corresponding integrating timer is reset, but also the serial number of the currently installed disk unit is registered in the disk serial number storage memory. Therefore, the invention can provide the advantage that the content stored in the integrating timer can be held correctly even if the disk unit is replaced.

Still further, by operating the integrating timer count display selector switch means, the progressive operating time of either one of disk unit A and disk unit B can be displayed selectively. Therefore, the invention can provide the advantage that not only whether or not a disk unit should be replaced can be judged with ease, but also the size of the system is not increased due to such display function.

The entire disclosure of each and every foreign patent application from which the benefit of foreign priority has been claimed in the present application is incorporated herein by reference, as if fully set forth.

Although this invention has been described in at least one preferred embodiment with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. A disk system comprising:
   a central processing unit having an operational processing section and storage means for storing programs to be executed by the operational processing section;
   first and second disks, each said disk being capable of receiving and transmitting data from and to an external unit through said central processing unit;
   first switch means settable so that a content of said first disk is transferred to said second disk or a content of said second disk is transferred to said first disk; and
   second switch means for instructing said central processing unit to execute data transfer between said first and second disks based on a setting of said first switch means,
   wherein said central processing unit executing data transfer between said first and second disks based on settings of said first and second switch means by a predetermined program stored in said storage means at a timing other than a timing during which at least one of said first and second disks is intercommunicating with said external unit.

2. The disk system according to claim 1, further comprising a transfer block setting means settable between a first state where data transfer between said first and second disks is blocked and a second state where data transfer is not blocked, wherein the data transfer between said first and second disks is blocked as long as said transfer block setting means is set to a transfer block mode even if said second switch means instructs said central processing unit to transfer data between said first and second disks.

3. The disk system according to claim 1 further comprising an error data storage memory for chronologically storing error data when an error occurs at the time said first or second disk is accessed, wherein a content of said error data storage memory can be read by said external unit.

4. The disk system according to claim 2 further comprising an error data storage memory for chronologically storing error data when an error occurs at the time said first or second disk is accessed, wherein a content of said error data storage memory can be read by said external unit.

5. The disk system according to claim 1, further comprising a first integrating timer for holding a total conducting time of said first disk, and a second integrating timer for holding a total conducting time of said second disk, wherein contents of said first and second integrating timers can be read by said external unit.

6. The disk system according to claim 2, further comprising a first integrating timer for holding a total conducting time of said first disk, and a second integrating timer for holding a total conducting time of said second disk, wherein contents of said first and second integrating timers can be read by said external unit.

7. The disk system according to claim 5, further comprising a serial number storage memory for holding a stored content thereof at the time a power supply is disconnected, wherein a serial number of said first disk registered in said serial number storage memory is read, whether the read content coincides with a serial number of the currently installed first disk is judged, and if the read content does not coincide with the serial number of the currently installed first disk, the stored content of said first integrating timer is reset and the serial number of the currently installed first disk is registered to said serial number storage memory.

8. The disk system according to claim 5, further comprising integrating timer display selector switch means for setting so that a stored content of said first or second integrating timer is displayed, and display means for displaying the stored content of said first or second integrating timer based on the setting of said integrating timer display selector switch means.

9. An FA controller comprising:
   a disk controller comprising:
   a central processing unit having an operational processing section and storage means for storing programs to be executed by the operational processing section;
   first and second disks, each said disk being capable of receiving and transmitting data from and to an external unit through said central processing unit;
   first switch means settable so that a content of said first disk is transferred to said second disk or a content of said second disk is transferred to said first disk; and
   second switch means for instructing said central processing unit to execute data transfer between said first and second disks based on a setting of said first switch means,
   wherein said central processing unit executing data transfer between said first and second disks based on settings of said first and second switch means by a predetermined program stored in said storage means at a timing other than a timing during which at least one of said first and second disks is intercommunicating with said external unit; and an upper-level central processing unit, which is an external unit of said disk system.

10. A method of controlling a disk system comprising a central processing unit having an operational processing section and storage means for storing programs to be executed by the operational processing section and at least first and second disks, each said disk being capable of receiving and transmitting data from and to an external unit through said central processing unit, comprising:

identifying a first condition in which a content of said first disk is transferred to said second disk and a second condition in which a content of said second disk is transferred to said first disk; and instructing said central processing unit to execute data transfer between said first and second disks based on a setting of said first switch means, wherein said central processing unit executing data transfer between said first and second disks based on said first and second conditions by a predetermined program stored in said storage means at a timing other than a timing during which at least one of said first and second disks is intercommunicating with said external unit.

11. The method of controlling a disk system according to claim 10, further comprising:

selecting a first state where data transfer between said first and second disks is blocked and a second state where data transfer is not blocked; and when said first state is selected, blocking data transfer between said first and second disks as long as said first state remains selected, even if said central processing unit is instructed in said instructing step to transfer data between said first and second disks.

12. The method of controlling a disk system according to claim 10 further comprising:

chronologically storing error data when an error occurs at the time said first or second disk is accessed; and subsequently reading said stored error data externally.

13. The method of controlling a disk system according to claim 11 further comprising:

chronologically storing error data when an error occurs at the time said first or second disk is accessed; and subsequently reading said stored error data externally.

14. The method of controlling a disk system according to claim 11, further comprising:

holding a total conducting time of said first disk;

holding a total conducting time of said second disk; and reading, by an external unit, said held total conducting time of said first disk and said held total conducting time of said second disk.

15. A disk system comprising:

a central processing unit having an operational processing section and storage means for storing programs to be executed by the operational processing section;

first and second disks, each said disk being capable of receiving and transmitting data from and to an external unit through said central processing unit;

first switch means settable so that a content of said first disk is transferred to said second disk or a content of said second disk is transferred to said first disk; and second switch means for instructing said central processing unit to execute data transfer between said first and second disks based on a setting of said first switch means, wherein said central processing unit executing data transfer between said first and second disks based on settings of said first and second switch means by a predetermined program stored in said storage means at a timing during which neither said first disk nor said second disk is intercommunicating with said external unit.

\* \* \* \* \*